(12) United States Patent
Shtrom et al.

(10) Patent No.: US 7,864,119 B2
(45) Date of Patent: Jan. 4, 2011

(54) ANTENNA ARRAY

(75) Inventors: Victor Shtrom, Sunnyvale, CA (US);
Darin T. Milton, Campbell, CA (US);
William S. Kish, Saratoga, CA (US)

(73) Assignee: Ruckus Wireless, Inc., Sunnyvale, CA (US)

( * ) Notice: Subject to any disclaimer, the term of this patent is extended or adjusted under 35 U.S.C. 154(b) by 0 days.

(21) Appl. No.: 12/851,472

(22) Filed: Aug. 5, 2010

(65) Prior Publication Data

US 2010/0302126 A1    Dec. 2, 2010

Related U.S. Application Data

(63) Continuation of application No. 12/425,374, filed on Apr. 16, 2009, which is a continuation of application No. 11/714,707, filed on Mar. 5, 2007, now Pat. No. 7,525,486, which is a continuation of application No. 11/022,080, filed on Dec. 23, 2004, now Pat. No. 7,193,562.

(60) Provisional application No. 60/630,499, filed on Nov. 22, 2004.

(51) Int. Cl.
*H01Q 1/38* (2006.01)
*H01Q 9/28* (2006.01)
*H01Q 3/24* (2006.01)

(52) U.S. Cl. ........................... 343/700 MS; 343/795; 343/876

(58) Field of Classification Search .......... 343/700 MS, 343/793, 795, 846, 876
See application file for complete search history.

(56) References Cited

U.S. PATENT DOCUMENTS

| 5,754,145 | A  | * | 5/1998  | Evans ......................... 343/795 |
| 7,193,562 | B2 | * | 3/2007  | Shtrom et al. .......... 343/700 MS |
| 7,298,228 | B2 | * | 11/2007 | Sievenpiper ................. 333/101 |

* cited by examiner

*Primary Examiner*—Shih-Chao Chen
(74) *Attorney, Agent, or Firm*—Carr & Ferrell LLP

(57) ABSTRACT

A circuit board for wireless communications includes communication circuitry for modulating and/or demodulating a radio frequency (RF) signal and an antenna apparatus for transmitting and receiving the RF signal, the antenna apparatus having selectable antenna elements located near one or more peripheries of the circuit board. A first antenna element produces a first directional radiation pattern; a second antenna element produces a second directional radiation pattern offset from the first radiation pattern. The antenna elements may include one or more reflectors configured to provide gain and broaden the frequency response of the antenna element. A switching network couples one or more of the selectable elements to the communication circuitry and provides impedance matching regardless of which or how many of the antenna elements are selected. Selecting different combinations of antenna elements results in a configurable radiation pattern; alternatively, selecting several elements may result in an omnidirectional radiation pattern.

14 Claims, 5 Drawing Sheets

ANTENNA ARRAY

CROSS-REFERENCE TO RELATED APPLICATIONS

The present application is a continuation and claims the priority benefit of U.S. patent application Ser. No. 12/425,374 filed Apr. 16, 2009, which is a continuation and claims the priority benefit of U.S. patent application Ser. No. 11/714,707 filed Mar. 5, 2007 and now U.S. Pat. No. 7,525,486, which is a continuation and claims the priority benefit of U.S. patent application Ser. No. 11/022,080 filed Dec. 23, 2004 and now U.S. Pat. No. 7,193,562, which claims the priority benefit of U.S. provisional patent application No. 60/630,499 filed Nov. 22, 2004. The disclosure of each of these applications is incorporated herein by reference.

The present application is related to U.S. patent application Ser. No. 11/010,076 filed Dec. 9, 2004, which is also incorporated herein by reference.

BACKGROUND

1. Field of the Invention

The present invention relates generally to wireless communications, and more particularly to a circuit board having a peripheral antenna apparatus with selectable antenna elements.

2. Description of the Related Art

In communications systems, there is an ever-increasing demand for higher data throughput and a corresponding drive to reduce interference that can disrupt data communications. For example, in an IEEE 802.11 network, an access point (i.e., base station) communicates data with one or more remote receiving nodes (e.g., a network interface card) over a wireless link. The wireless link may be susceptible to interference from other access points, other radio transmitting devices, changes or disturbances in the wireless link environment between the access point and the remote receiving node, and so on. The interference may be such to degrade the wireless link, for example by forcing communication at a lower data rate, or may be sufficiently strong to completely disrupt the wireless link.

One solution for reducing interference in the wireless link between the access point and the remote receiving node is to provide several omnidirectional antennas for the access point, in a "diversity" scheme. For example, a common configuration for the access point comprises a data source coupled via a switching network to two or more physically separated omnidirectional antennas. The access point may select one of the omnidirectional antennas by which to maintain the wireless link. Because of the separation between the omnidirectional antennas, each antenna experiences a different signal environment, and each antenna contributes a different interference level to the wireless link. The switching network couples the data source to whichever of the omnidirectional antennas experiences the least interference in the wireless link.

However, one limitation with using two or more omnidirectional antennas for the access point is that each omnidirectional antenna comprises a separate unit of manufacture with respect to the access point, thus requiring extra manufacturing steps to include the omnidirectional antennas in the access point. A further limitation is that the omnidirectional antenna typically comprises an upright wand attached to a housing of the access point. The wand typically comprises a rod exposed outside of the housing, and may be subject to breakage or damage.

Another limitation is that typical omnidirectional antennas are vertically polarized. Vertically polarized radio frequency (RF) energy does not travel as efficiently as horizontally polarized RF energy inside a typical office or dwelling space, additionally, most laptop computer network interface cards have horizontally polarized antennas. Typical solutions for creating horizontally polarized RF antennas to date have been expensive to manufacture, or do not provide adequate RF performance to be commercially successful.

A still further limitation with the two or more omnidirectional antennas is that because the physically separated antennas may still be relatively close to each other, each of the several antennas may experience similar levels of interference and only a relatively small reduction in interference may be gained by switching from one omnidirectional antenna to another omnidirectional antenna.

SUMMARY

In a first claimed embodiment, an antenna system is disclosed which includes communication circuitry located in an interior area of a circuit board. The communication circuitry generates an RF signal and provides the RF signal into a feed line distribution point of the circuit board. A plurality of antenna elements are arranged proximate edges of the circuit board to surround the communication circuitry. A first antenna element and a second antenna element in the plurality of antenna elements are arranged to produce respective directional radiation patterns oriented in substantially the same direction when coupled to the communication circuitry. A switching network selectively couples one or more of the plurality of antenna elements to the communication circuitry. The switching network is arranged between the plurality of antenna elements and the feed line distribution point.

In a second claimed embodiment, an antenna system is disclosed which includes communication circuitry located in an interior area of a circuit board. The communication circuitry generates an RF signal. A plurality of antenna elements are arranged proximate edges of the circuit board to surround the communication circuitry. A first antenna element and a second antenna element in the plurality of antenna elements are arranged to produce respective directional radiation patterns oriented in substantially the same direction when coupled to the communication circuitry. A given antenna element in the plurality of antenna elements includes a first portion on a first layer of the circuit board and coupled to a feed line on the first layer, and includes a second portion on a second layer of the circuit board and coupled to the first layer by an array of metalized vias. A switching network selectively couples one or more of the plurality of antenna elements to the communication circuitry.

BRIEF DESCRIPTION OF THE DRAWINGS

The present invention will now be described with reference to drawings that represent a preferred embodiment of the invention. In the drawings, like components have the same reference numerals. The illustrated embodiment is intended to illustrate, but not to limit the invention. The drawings include the following figures.

DETAILED DESCRIPTION

A system for a wireless (i.e., radio frequency or RF) link to a remote receiving device includes a circuit board comprising communication circuitry for generating an RF signal and an antenna apparatus for transmitting and/or receiving the RF signal. The antenna apparatus includes two or more antenna elements arranged near the periphery of the circuit board. Each of the antenna elements provides a directional radiation pattern. In some embodiments, the antenna elements may be electrically selected (e.g., switched on or off) so that the antenna apparatus may form configurable radiation patterns. If multiple antenna elements are switched on, the antenna apparatus may form an omnidirectional radiation pattern.

Advantageously, the circuit board interconnects the communication circuitry and provides the antenna apparatus in one easily manufacturable printed circuit board. Including the antenna apparatus in the printed circuit board reduces the cost to manufacture the circuit board and simplifies interconnection with the communication circuitry. Further, including the antenna apparatus in the circuit board provides more consistent RF matching between the communication circuitry and the antenna elements. A further advantage is that the antenna apparatus radiates directional radiation patterns substantially in the plane of the antenna elements. When mounted horizontally, the radiation patterns are horizontally polarized, so that RF signal transmission indoors is enhanced as compared to a vertically polarized antenna.

Figure 1:
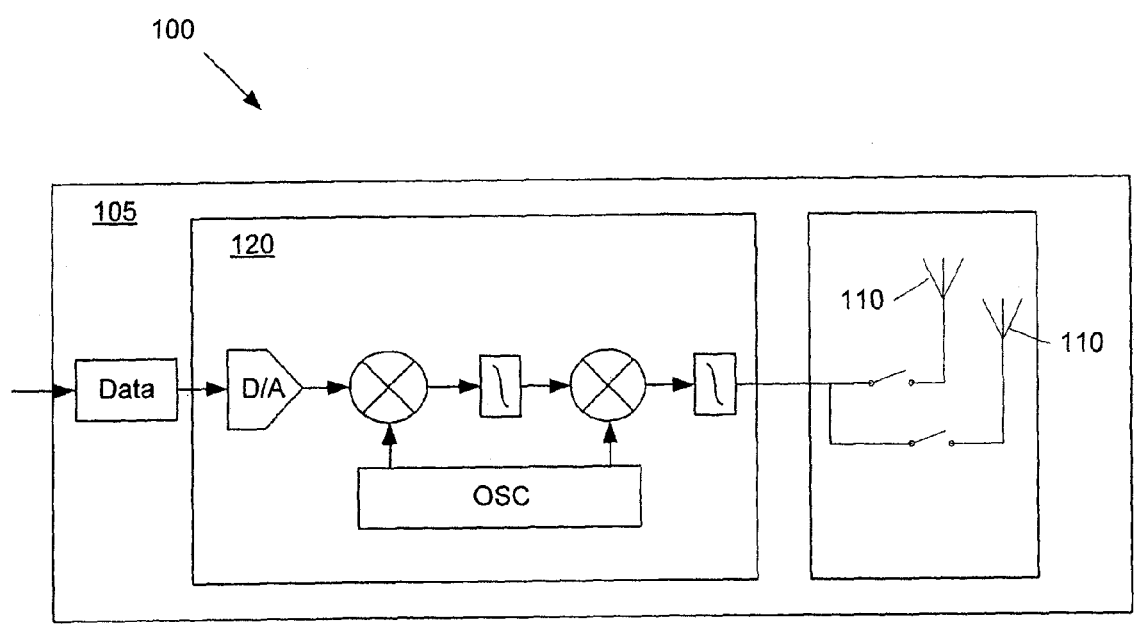
FIG. 1 illustrates an exemplary schematic for a system incorporating a circuit board having a peripheral antenna apparatus with selectable elements, in one embodiment in accordance with the present invention.

FIG. 1 illustrates an exemplary schematic for a system 100 incorporating a circuit board having a peripheral antenna apparatus with selectable elements, in one embodiment in accordance with the present invention. The system 100 may comprise, for example without limitation, a transmitter/receiver such as an 802.11 access point, an 802.11 receiver, a set-top box, a laptop computer, a television, a cellular telephone, a cordless telephone, a wireless VoIP phone, a remote control, and a remote terminal such as a handheld gaming device. In some exemplary embodiments, the system 100 comprises an access point for communicating to one or more remote receiving nodes over a wireless link, for example in an 802.11 wireless network.

The system 100 comprises a circuit board 105 including a radio modulator/demodulator (modem) 120 and a peripheral antenna apparatus 110. The radio modem 120 may receive data from a router connected to the Internet (not shown), convert the data into a modulated RF signal, and the antenna apparatus 110 may transmit the modulated RF signal wirelessly to one or more remote receiving nodes (not shown). The system 100 may also form a part of a wireless local area network by enabling communications among several remote receiving nodes. Although the disclosure will focus on a specific embodiment for the system 100 including the circuit board 105, aspects of the invention are applicable to a wide variety of appliances, and are not intended to be limited to the disclosed embodiment. For example, although the system 100 may be described as transmitting to a remote receiving node via the antenna apparatus 110, the system 100 may also receive RF-modulated data from the remote receiving node via the antenna apparatus 110.

Figure 2:
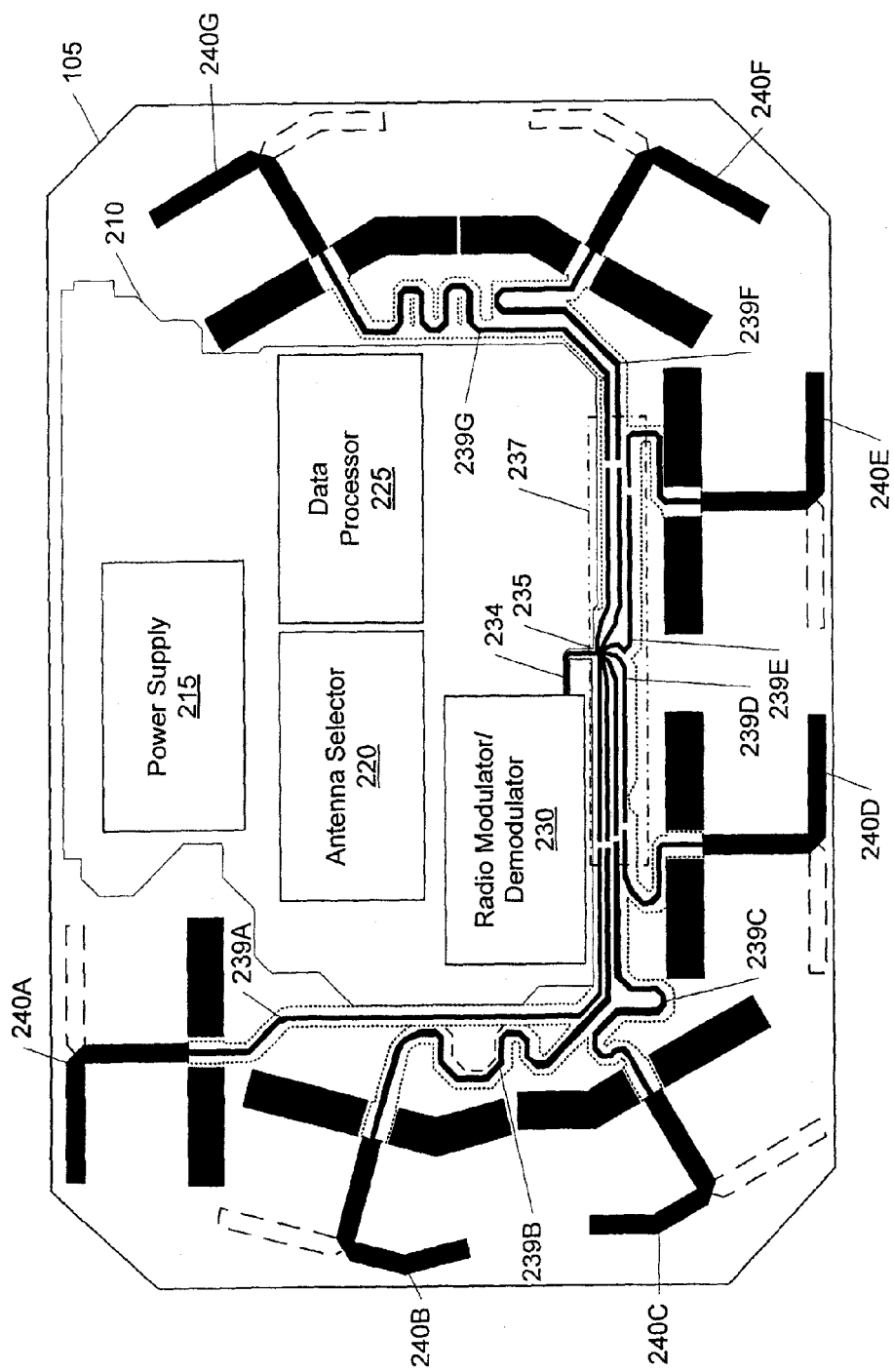
FIG. 2 illustrates the circuit board having the peripheral antenna apparatus with selectable elements of FIG. 1, in one embodiment in accordance with the present invention.

FIG. 2 illustrates the circuit board 105 having the peripheral antenna apparatus 110 with selectable elements of FIG. 1, in one embodiment in accordance with the present invention. In some embodiments, the circuit board 105 comprises a printed circuit board (PCB) such as FR4, Rogers 4003, or other dielectric material with four layers, although any number of layers is comprehended, such as six.

The circuit board 105 includes an area 210 for interconnecting circuitry including for example a power supply 215, an antenna selector 220, a data processor 225, and a radio modulator/demodulator (modem) 230. In some embodiments, the data processor 225 comprises well-known circuitry for receiving data packets from a router connected to the Internet (e.g., via a local area network). The radio modem 230 comprises communication circuitry including virtually any device for converting the data packets processed by the data processor 225 into a modulated RF signal for transmission to one or more of the remote receiving nodes, and for reception therefrom. In some embodiments, the radio modem 230 comprises circuitry for converting the data packets into an 802.11 compliant modulated RF signal.

From the radio modem 230, the circuit board 105 also includes a microstrip RF line 234 for routing the modulated RF signal to an antenna feed port 235. Although not shown, in some embodiments, an antenna feed port 235 is configured to distribute the modulated RF signal directly to antenna elements 240A-240G of the peripheral antenna apparatus 110 (not labeled) by way of antenna feed lines. In the embodiment depicted in FIG. 2, the antenna feed port 235 is configured to distribute the modulated RF signal to one or more of the selectable antenna elements 240A-240G by way of a switching network 237 and microstrip feed lines 239A-239G. Although described as microstrip, the feed lines 239 may also comprise coupled microstrip, coplanar strips with impedance transformers, coplanar waveguide, coupled strips, and the like.

The antenna feed port 235, the switching network 237, and the feed lines 239 comprise switching and routing components on the circuit board 105 for routing the modulated RF signal to the antenna elements 240A-240G. As described further herein, the antenna feed port 235, the switching network 237, and the feed lines 239 include structures for impedance matching between the radio modem 230 and the antenna elements 240. The antenna feed port 235, the switching network 237, and the feed lines 239 are further described with respect to FIG. 5.

As described further herein, the peripheral antenna apparatus comprises a plurality of antenna elements 240A-240G located near peripheral areas of the circuit board 105. Each of the antenna elements 240 produces a directional radiation pattern with gain (as compared to an omnidirectional antenna) and with polarization substantially in the plane of the circuit board 105. Each of the antenna elements may be arranged in an offset direction from the other antenna elements 240 so that the directional radiation pattern produced by one antenna element (e.g., the antenna element 240A) is offset in direction from the directional radiation pattern produced by another antenna element (e.g., the antenna element 240C). Certain antenna elements may also be arranged in substantially the same direction, such as the antenna elements 240D and 240E. Arranging two or more of the antenna elements 240 in the same direction provides spatial diversity between the antenna elements 240 so arranged.

In embodiments with the switching network 237, selecting various combinations of the antenna elements 240 produces various radiation patterns ranging from highly directional to omnidirectional. Generally, enabling adjacent antenna elements 240 results in higher directionality in azimuth as compared to selecting either of the antenna elements 240 alone. For example, selecting the adjacent antenna elements 240A and 240B may provide higher directionality than selecting either of the antenna elements 240A or 240B alone. Alternatively, selecting every other antenna element (e.g., the antenna elements 240A, 240C, 240E, and 240G) or all of the antenna elements 240 may produce an omnidirectional radiation pattern.

The operating principle of the selectable antenna elements 240 may be further understood by review of co-pending U.S. patent application Ser. No. 11/010,076, entitled "System and Method for an Omnidirectional Planar Antenna Apparatus with Selectable Elements," filed Dec. 9, 2004, and previously incorporated herein by reference.

Figure 3A:
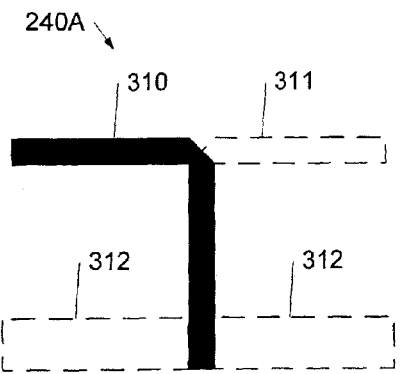
FIG. 3A illustrates a modified dipole for the antenna apparatus of FIG. 2, in one embodiment in accordance with the present invention.

FIG. 3A illustrates the antenna element 240A of FIG. 2, in one embodiment in accordance with the present invention. The antenna element 240A of this embodiment comprises a modified dipole with components on both exterior surfaces of the circuit board 105 (considered as the plane of FIG. 3A). Specifically, on a first surface of the circuit board 105, the antenna element 240A includes a first dipole component 310. On a second surface of the circuit board 105, depicted by dashed lines in FIG. 3, the antenna element 240A includes a second dipole component 311 extending substantially opposite from the first dipole component 310. The first dipole component 310 and the second dipole component 311 form the antenna element 240A to produce a generally cardioid directional radiation pattern substantially in the plane of the circuit board.

In some embodiments, such as the antenna elements 240B and 240C of FIG. 2, the dipole component 310 and/or the dipole component 311 may be bent to conform to an edge of the circuit board 105. Incorporating the bend in the dipole component 310 and/or the dipole component 311 may reduce the size of the circuit board 105. Although described as being formed on the surface of the circuit board 105, in some embodiments the dipole components 310 and 311 are formed on interior layers of the circuit board, as described herein.

The antenna element 240A may optionally include one or more reflectors (e.g., the reflector 312). The reflector 312 comprises elements that may be configured to concentrate the directional radiation pattern formed by the first dipole component 310 and the second dipole component 311. The reflector 312 may also be configured to broaden the frequency response of the antenna component 240A. In some embodiments, the reflector 312 broadens the frequency response of each modified dipole to about 300 MHz to 500 MHz. In some embodiments, the combined operational bandwidth of the antenna apparatus resulting from coupling more than one of the antenna elements 240 to the antenna feed port 235 is less than the bandwidth resulting from coupling only one of the antenna elements 240 to the antenna feed port 235. For example, with four antenna elements 240 (e.g., the antenna elements 240A, 240C, 240E, and 240G) selected to result in an omnidirectional radiation pattern, the combined frequency response of the antenna apparatus is about 90 MHz. In some embodiments, coupling more than one of the antenna elements 240 to the antenna feed port 235 maintains a match with less than 10 dB return loss over 802.11 wireless LAN frequencies, regardless of the number of antenna elements 240 that are switched on.

Figure 3B:
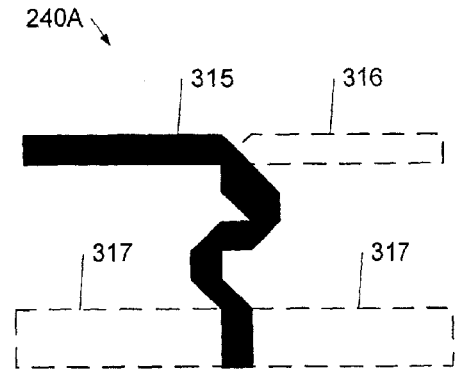
FIG. 3B illustrates a size reduced modified dipole for the antenna apparatus of FIG. 2, in an alternative embodiment in accordance with the present invention.

FIG. 3B illustrates the antenna element 240A of FIG. 2, in an alternative embodiment in accordance with the present invention. The antenna element 240A of this embodiment may be reduced in dimension as compared to the antenna element 240A of FIG. 3A. Specifically, the antenna element 240A of this embodiment comprises a first dipole component 315 incorporating a meander, a second dipole component 316 incorporating a corresponding meander, and a reflector 317. Because of the meander, the antenna element 240A of this embodiment may require less space on the circuit board 105 as compared to the antenna element 240A of FIG. 3A.

Figure 3C:
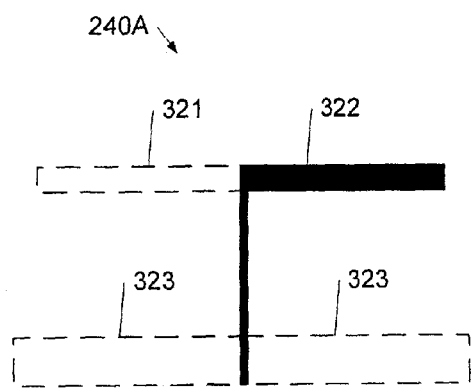
FIG. 3C illustrates an alternative modified dipole for the antenna apparatus of FIG. 2, in an alternative embodiment in accordance with the present invention.

FIG. 3C illustrates the antenna element 240A of FIG. 2, in an alternative embodiment in accordance with the present invention. The antenna element 240A of this embodiment includes one or more components on one or more layers internal to the circuit board 105. Specifically, in one embodiment, a first dipole component 321 is formed on an internal ground plane of the circuit board 105. A second dipole component 322 is formed on an exterior surface of the circuit board 105. As described further with respect to FIG. 4, a reflector 323 may be formed internal to the circuit board 105, or may be formed on the exterior surface of the circuit board 105. An advantage of this embodiment of the antenna element 240A is that vias through the circuit board 105 may be reduced or eliminated, making the antenna element 240A of this embodiment less expensive to manufacture.

Figure 3D:
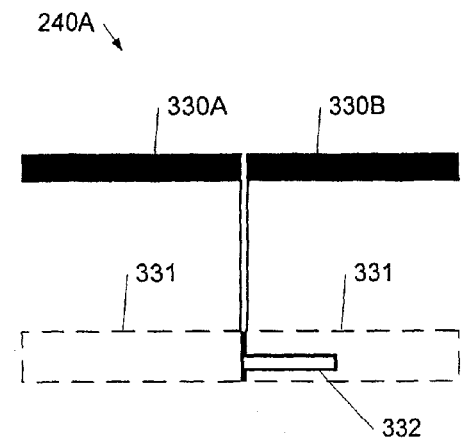
FIG. 3D illustrates a modified dipole with coplanar strip transition for the antenna apparatus of FIG. 2, in an alternative embodiment in accordance with the present invention.

FIG. 3D illustrates the antenna element 240A of FIG. 2, in an alternative embodiment in accordance with the present invention. The antenna element 240A of this embodiment includes a modified dipole with a microstrip to coplanar strip (CPS) transition 332 and CPS dipole arms 330A and 330B on a surface layer of the circuit board 105. Specifically, this embodiment provides that the CPS dipole arm 330A may be coplanar with the CPS dipole arm 330B, and may be formed on the same surface of the circuit board 105. This embodiment may also include a reflector 331 formed on one or more interior layers of the circuit board 105 or on the opposite surface of the circuit board 105. An advantage of this embodiment is that no vias are needed in the circuit board 105.

It will be appreciated that the dimensions of the individual components of the antenna elements 240A-G (e.g., the first dipole component 310, the second dipole component 311, and the reflector 312) depend upon a desired operating frequency of the antenna apparatus. Furthermore, it will be appreciated that the dimensions of wavelength depend upon conductive and dielectric materials comprising the circuit board 105, because speed of electron propagation depends upon the properties of the circuit board 105 material. Therefore, dimensions of wavelength referred to herein are intended specifically to incorporate properties of the circuit board, including considerations such as the conductive and dielectric properties of the circuit board 105. The dimensions of the individual components may be established by use of RF simulation software, such as IE3D from Zeland Software of Fremont, Calif.

Figure 4:
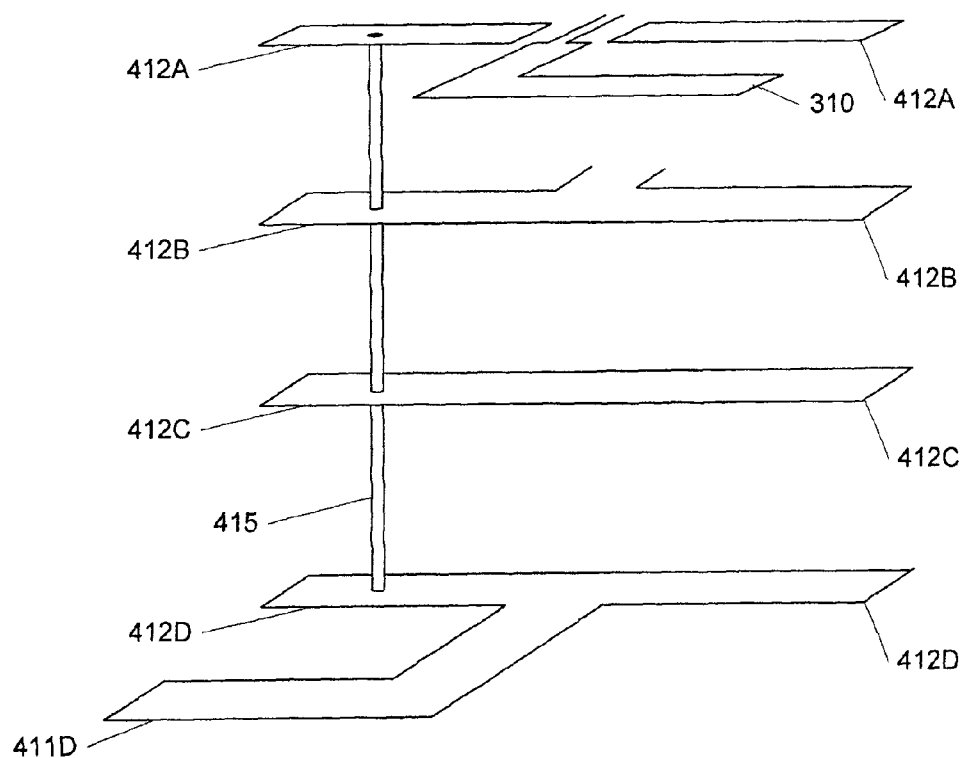
FIG. 4 illustrates the antenna element of FIG. 3A, showing multiple layers of the circuit board, in one embodiment of the invention.

FIG. 4 illustrates the antenna element 240A of FIG. 3A, showing multiple layers of the circuit board 105, in one embodiment of the invention. The circuit board 105 of this embodiment comprises a 60 mil thick stackup with three dielectrics and four metallization layers A-D, with an internal RF ground plane at layer B (10 mils from top layer A to the internal ground layer B). Layer B is separated by a 40 mil thick dielectric to the next layer C, which may comprise a power plane. Layer C is separated by a 10 mil dielectric to the bottom layer D.

The first dipole component 310 and portions 412A of the reflector 312 is formed on the first (exterior) surface layer A. In the second metallization layer B, which includes a connection to the ground layer (depicted as an open trace), corresponding portions 412B of the reflector 312 are formed. On the third metallization layer C, corresponding portions 412C of the reflector 312 are formed. The second dipole component 411D is formed along with corresponding portions of the reflector 412D on the fourth (exterior) surface metallization layer D. The reflectors 412A-D and the second dipole component 411B-D on the different layers are interconnected to the ground layer B by an array of metallized vias 415 (only one via 415 shown, for clarity) spaced less than 1/20th of a wavelength apart, as determined by an operating RF frequency range of 2.4-2.5 GHz for 802.11. It will be apparent to a person or ordinary skill that the reflector 312 comprises four layers, depicted as 412A-D.

An advantage of the antenna element 240A of FIG. 4 is that transitions in the RF path are avoided. Further, because of the cutaway portion of the reflector 412A and the array of vias interconnecting the layers of the circuit board 105, the antenna element 240A of this embodiment offers a good ground plane for the ground dipole 311 and the reflector element 312.

Figure 5A:
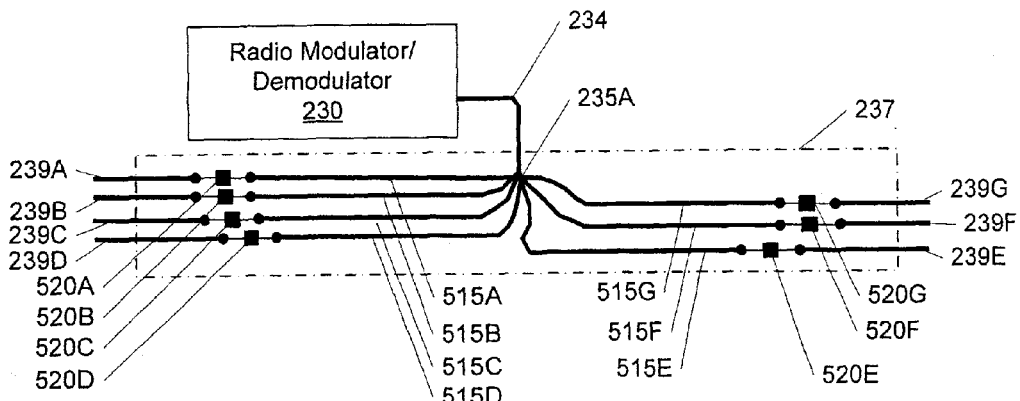
FIG. 5A illustrates the antenna feed port and the switching network of FIG. 2, in one embodiment in accordance with the present invention.

FIG. 5A illustrates the antenna feed port 235 and the switching network 237 of FIG. 2, in one embodiment in accordance with the present invention. The antenna feed port 235 of this embodiment receives the RF line 234 from the radio modem 230 into a distribution point 235A. From the distribution point 235A, impedance matched RF traces 515A-G extend to PIN diodes 520A-G. In one embodiment, the RF traces 515A-G comprise 20 mils wide traces, based upon a 10 mil dielectric from the internal ground layer (e.g., the ground layer B of FIG. 4). Feed lines 239A-G (only portions of the feed lines 239 are shown for clarity) extend from the PIN diodes 520A-G to each of the antenna elements 240.

Each PIN diode 520 comprises a single-pole single-throw switch to switch each antenna element 240 either on or off (i.e., couple or decouple each of the antenna elements 240 to the antenna feed port 235). In one embodiment, a series of control signals (not shown) is used to bias each PIN diode 520. With the PIN diode 520 forward biased and conducting a DC current, the PIN diode 520 is switched on, and the corresponding antenna element 240 is selected. With the PIN diode 520 reverse biased, the PIN diode 520 is switched off.

In one embodiment, the RF traces 515A-G are of length equal to a multiple of one half wavelength from the antenna feed port 235. Although depicted as equal length in FIG. 5A, the RF traces 515A-G may be unequal in length, but multiples of one half wavelength from the antenna feed port 235. For example, the RF trace 515A may be of zero length so that the PIN diode 520A is directly attached to the antenna feed port 235. The RF trace 515B may be one half wavelength, the RF trace 515C may be one wavelength, and so on, in any combination. The PIN diodes 520A-G are multiples of one half wavelength from the antenna feed port 235 so that disabling one PIN diode (e.g. the PIN diode 520A) does not create an RF mismatch that would cause RF reflections back to the distribution point 235A and to other traces 515 that are enabled (e.g., the trace 515B). In this fashion, when the PIN diode 540A is "off," the radio modem 230 sees a high impedance on the trace 515A, and the impedance of the trace 515B that is "on" is virtually unaffected by the PIN diode 540A. In some embodiments, the PIN diodes 520A-G are located at an offset from the one half wavelength distance. The offset is determined to account for stray capacitance in the distribution point 235A and/or the PIN diodes 520A-G.

Figure 5B:
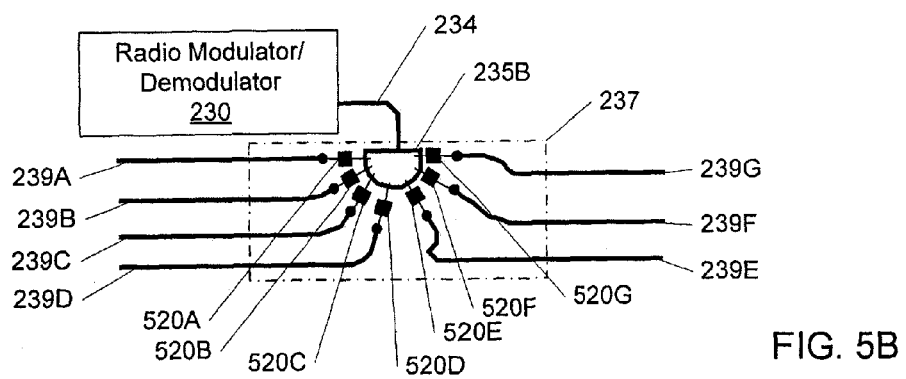
FIG. 5B illustrates the antenna feed port and the switching network of FIG. 2, in an alternative embodiment in accordance with the present invention.

FIG. 5B illustrates the antenna feed port 235 and the switching network 237 of FIG. 2, in an alternative embodiment in accordance with the present invention. The antenna feed port 235 of this embodiment receives the RF line 234 from the radio modem 230 into a distribution point 235B. The distribution point 235B of this embodiment is configured as a solder pad for the PIN diodes 520A-G. The PIN diodes 520A-G are soldered between the distribution point 235B and the ends of the feed lines 239A-G. In essence, the distribution point 235B of this embodiment acts as a zero wavelength distance from the antenna feed port 235. An advantage of this embodiment is that the feed lines extending from the PIN diodes 520A-G to the antenna elements 240A-G offer unbroken controlled impedance.

Figure 5C:
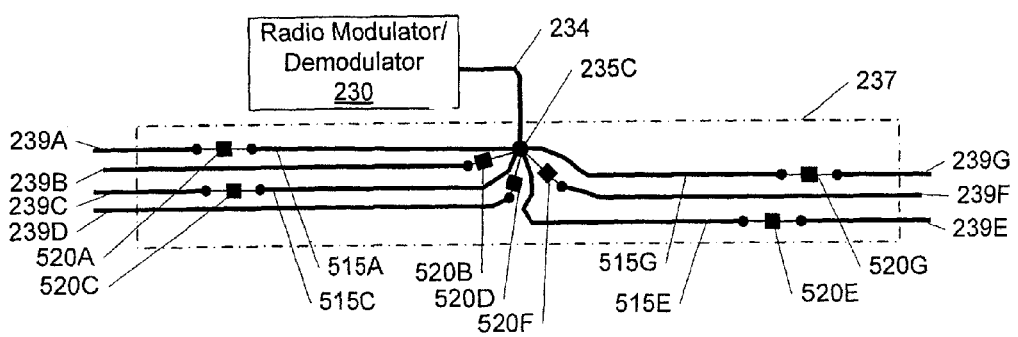
FIG. 5C illustrates the antenna feed port and the switching network of FIG. 2, in an alternative embodiment in accordance with the present invention.

FIG. 5C illustrates the antenna feed port and the switching network of FIG. 2, in an alternative embodiment in accordance with the present invention. This embodiment may be considered as a combination of the embodiments depicted in FIGS. 5A and 5B. The PIN diodes 520A, 520C, 520E, and 520G are connected to the RF traces 515A, 515C, 515E, and 515G, respectively, in similar fashion to that described with respect to FIG. 5A. However, the PIN diodes 520B, 520D, and 520F are soldered to a distribution point 235C and to the corresponding feed lines 239B, 239D, and 239F, in similar fashion to that described with respect to FIG. 5B.

Although the switching network 237 is described as comprising PIN diodes 520, it will be appreciated that the switching network 237 may comprise virtually any RF switching device such as a GaAs FET, as is well known in the art. In some embodiments, the switching network 237 comprises one or more single-pole multiple-throw switches. In some embodiments, one or more light emitting diodes (not shown) are coupled to the switching network 237 or the feed lines 239 as a visual indicator of which of the antenna elements 240 is on or off. In one embodiment, a light emitting diode is placed in circuit with each PIN diode 520 so that the light emitting diode is lit when the corresponding antenna element 240 is selected.

Referring to FIG. 2, because in some embodiments the antenna feed port 235 is not in the center of the circuit board 105, which would make the antenna feed lines 239 of equal length and minimum loss, the lengths of the antenna feed lines 239 may not comprise equivalent lengths from the antenna feed port 235. Unequal lengths of the antenna feed lines 239 may result in phase offsets between the antenna elements 240. Accordingly, in some embodiments not shown in FIG. 2, each of the feed lines 239 to the antenna elements 240 are designed to be as long as the longest of the feed lines 239, even for antenna elements 240 that are relatively close to the antenna feed port 235. In some embodiments, the lengths of the feed lines 239 are designed to be a multiple of a half-wavelength offset from the longest of the feed lines 239. In still other embodiments, the lengths of the feed lines 239 which are odd multiples of one half wavelength from the other feed lines 239 incorporate a "phase-inverted" antenna element 240 to compensate. For example, referring to FIG. 2, the antenna elements 240C and 240F are inverted by 180 degrees because the feed lines 239C and 239F are 180 degrees out of phase from the feed lines 239A, 239B, 239D, 239E, and 239G. In an antenna element 240 that is phase inverted, the first dipole component (e.g., surface layer) replaces the second dipole component (e.g., ground layer). It will be appreciated that this provides the 180 degree phase shift in the antenna element to compensate for the 180 degree feed line phase shift.

An advantage of the system 100 (FIG. 1) incorporating the circuit board 105 having the peripheral antenna apparatus with selectable antenna elements 240 (FIG. 2) is that the antenna elements 240 are constructed directly on the circuit board 105, therefore the entire circuit board 105 can be easily manufactured at low cost. As depicted in FIG. 2, one embodiment or layout of the circuit board 105 comprises a substantially square or rectangular shape, so that the circuit board 105 is easily panelized from readily available circuit board material. As compared to a system incorporating externally-mounted vertically polarized "whip" antennas for diversity, the circuit board 105 minimizes or eliminates the possibility of damage to the antenna elements 240.

A further advantage of the circuit board 105 incorporating the peripheral antenna apparatus with selectable antenna elements 240 is that the antenna elements 240 may be configured to reduce interference in the wireless link between the system 100 and a remote receiving node. For example, the system 100 communicating over the wireless link to the remote receiving node may select a particular configuration of selected antenna elements 240 that minimizes interference over the wireless link. For example, if an interfering signal is received strongly via the antenna element 240C, and the remote receiving node is received strongly via the antenna element 240A, selecting only the antenna element 240A may reduce the interfering signal as opposed to selecting the antenna element 240C. The system 100 may select a configuration of selected antenna elements 240 corresponding to a maximum gain between the system and the remote receiving node. Alternatively, the system 100 may select a configuration of selected antenna elements 240 corresponding to less than maximal gain, but corresponding to reduced interference. Alternatively, the antenna elements 240 may be selected to form a combined omnidirectional radiation pattern.

Another advantage of the circuit board 105 is that the directional radiation pattern of the antenna elements 240 is substantially in the plane of the circuit board 105. When the circuit board 105 is mounted horizontally, the corresponding radiation patterns of the antenna elements 240 are horizontally polarized. Horizontally polarized RF energy tends to propagate better indoors than vertically polarized RF energy. Providing horizontally polarized signals improves interference rejection (potentially, up to 20 dB) from RF sources that use commonly-available vertically polarized antennas.

The invention has been described herein in terms of several preferred embodiments. Other embodiments of the invention, including alternatives, modifications, permutations and equivalents of the embodiments described herein, will be apparent to those skilled in the art from consideration of the specification, study of the drawings, and practice of the invention. The embodiments and preferred features described above should be considered exemplary, with the invention being defined by the appended claims, which therefore include all such alternatives, modifications, permutations and equivalents as fall within the true spirit and scope of the present invention.

What is claimed is:

1. An antenna system, comprising:
   communication circuitry located in an interior area of a circuit board, the communication circuitry generating an RF signal and providing the RF signal into a feed line distribution point of the circuit board;
   a plurality of antenna elements arranged proximate edges of the circuit board to surround the communication circuitry, wherein a first antenna element and a second antenna element in the plurality of antenna elements are arranged to produce respective directional radiation patterns oriented in substantially the same direction when coupled to the communication circuitry; and
   a switching network that selectively couples one or more of the plurality of antenna elements to the communication circuitry, the switching network arranged between the plurality of antenna elements and the feed line distribution point.

2. The antenna system of claim 1, wherein the first and the second antenna elements have substantially identical physical dimensions.

3. The antenna system of claim 1, wherein the first and the second antenna elements are arranged along an axis substantially parallel to an edge of the circuit board.

4. The antenna system of claim 1, wherein the first and the second antenna elements are arranged along an axis substantially perpendicular to an edge of the circuit board.

5. The antenna system of claim 1, wherein at least one antenna element in the plurality of antenna elements has physical dimensions different than that of another antenna element in the plurality of antenna elements.

6. The antenna system of claim 1, wherein the switching network maintains a match at the feed line distribution point of at least 10 dB return loss of the RF signal when one or more antenna elements in the plurality of antenna elements are coupled to the feed line distribution point.

7. The antenna system of claim 1, wherein the switching network includes RF switches that selectively couple and decouple corresponding antenna elements in the plurality of antenna elements to the feed line distribution point, the RF switches respectively located at about a multiple of one-half wavelength from the feed-line distribution point.

8. The antenna system of claim 7, further comprising feed lines coupling the RF switches to the corresponding antenna elements.

9. The antenna system of claim 8, wherein each of the feed lines have substantially equal electrical length.

10. The antenna system of claim 7, wherein a first feed line of the feed lines has an electrical length different from that of a second feed line of the feed lines by a multiple of one-half wavelength of the RF signal.

11. The antenna system of claim 10, wherein the electrical length of the first feed line is different from that of the second feed line by an odd multiple of one-half wavelength of the RF signal.

12. The antenna system of claim 1, wherein the switching network selectively changes a frequency response of one or more of the plurality of antenna elements.

13. The antenna system of claim 1, wherein a given antenna element in the plurality of antenna elements is formed on a single layer of the circuit board.

14. An antenna system, comprising:

communication circuitry located in an interior area of a circuit board, the communication circuitry generating an RF signal;

a plurality of antenna elements arranged proximate edges of the circuit board to surround the communication circuitry, wherein a first antenna element and a second antenna element in the plurality of antenna elements are arranged to produce respective directional radiation patterns oriented in substantially the same direction when coupled to the communication circuitry, and wherein a given antenna element in the plurality of antenna elements includes a first portion on a first layer of the circuit board and coupled to a feed line on the first layer, and includes a second portion on a second layer of the circuit board and coupled to the first layer by an array of metalized vias; and a switching network that selectively couples one or more of the plurality of antenna elements to the communication circuitry.

\* \* \* \* \*